(12) United States Patent
Wu et al.

(10) Patent No.: US 6,441,436 B1
(45) Date of Patent: Aug. 27, 2002

(54) SOI DEVICE AND METHOD OF FABRICATION

(75) Inventors: De-Yuan Wu, Hsin-Chu; Chih-Cheng Liu, Pan-Chiao, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/725,094

(22) Filed: Nov. 29, 2000

(51) Int. Cl.$^7$ ................................................ H01L 27/01
(52) U.S. Cl. ...................... 257/350; 257/347; 257/349; 257/300; 257/288; 257/394
(58) Field of Search ................. 257/347, 349, 257/350, 300, 288, 394

(56) References Cited

U.S. PATENT DOCUMENTS 5,446,299 A * 8/1995 Acovic ........................ 257/316
5,807,772 A * 9/1998 Takemura .................... 438/157
6,037,199 A * 3/2000 Huang et al. ............... 438/166

FOREIGN PATENT DOCUMENTS

JP 62-81766 * 4/1987
JP 1-264256 * 10/1989

* cited by examiner

Primary Examiner—Nathan J. Flynn
Assistant Examiner—Ahmed N. Sefer
(74) Attorney, Agent, or Firm—Winston Hsu

(57) ABSTRACT

A SOI DRAM unit comprising a MOS transistor and an improved SOI substrate having a back-gate control. The SOI substrate includes a first insulating layer, a first semiconductor layer having a first conductivity type, a second insulating layer, and a second semiconductor layer having a first conductivity type formed on a substrate. The MOS transistor includes a gate formed on the second semiconductor layer and a source and drain region, having a second conductivity type, formed on either side of the gate in the second semiconductor layer, wherein the source and the drain electrically connects to a bit line and a capacitor, respectively. A first oxidation region is formed in the first semiconductor layer below the source region and a second oxidation region is formed in the first semiconductor layer below the drain region. Both the first oxidation and second oxidation regions are contiguous with the second insulating layer.

17 Claims, 5 Drawing Sheets

SOI DEVICE AND METHOD OF FABRICATION

BACKGROUND OF THE INVENTION

1. Field of the Invention

The present invention relates to a silicon-on-insulator (SOI) device, and more particularly, to a method of making a metal-oxide-semiconductor field-effect-transistor (MOSFET) on a SOI substrate of high threshold voltage and low junction leakage to form a high-performance dynamic random access memory (DRAM) cell.

2. Description of the Prior Art

As the dimensional aspect of devices continue to decrease, the parasitic effects of MOS devices have become a critical factor in both device performance and circuit integrity. Recently, silicon-on-insulator (SOI) substrates, normally formed by a Separation by Implantation Oxygen (SIMOX) method, have been developed as a solution. A metal-oxide-semiconductor field-effect transistor (MOSFET) formed on the SOI substrate is installed in a single crystal layer, and electrically isolated from an underlying silicon substrate by a silicon dioxide isolation layer; the structural layout of the MOSFET thereby prevents the latch up phenomenon of electrical devices and avoids electrical breakdown.

Due to the above advantages, the SOI substrate has been applied to many semiconductor products, such as dynamic random access memory (DRAM), erasable programmable read only memory (EPROM), electrically erasable programmable read only memory (EEPROM), flash memory, power IC and other consuming IC. However, the gradual increase in the application of the SOI device have created some problems which need to be resolved.

For example, a DRAM unit installed on a SOI substrate is normally biased a pre-selected voltage on the silicon layer of the SOI substrate to control both the threshold voltage ($V_t$) and sub-threshold voltage of a gate channel. However, the gate channel reaches an undesired floating state during standby mode due to the inability of the conventional SOI to force back-gate bias. This results in limitations in the applications of the SOI device to memory devices. Furthermore, sustaining a high threshold voltage (high $V_t$) requires the use of a high-dosage $V_t$ adjusting implant process which can lead to high junction leakage and low gate electrode breakage voltage. Also, the use of a large concentration of impurities causes decreased mobility which can reduce the channel performance of a device.

Hitherto, few methods have been proposed to resolve the above-mentioned problems. In U.S. Pat. No. 6,088,260, Choi and Jin Hyeok proposed the use of a SOI substrate to form a DRAM cell. The SOI substrate is provided with a conduction layer for a plate electrode using wafer bonding technology. Choi and Jin Hyeok further utilizes the SOI substrate with the plate electrode to fabricate a DRAM device without a stacked capacitor. Although the method disclosed by Choi and Hyeok produces an improved DRAM device, the above-mentioned problems still need to be resolved.

SUMMARY OF THE INVENTION

It is an objective of the present invention to provide a SOI device that is applicable to a DRAM cell by having back-gate control to obtain superior channel control performance and minimum parasitic effects without heavy doping for $V_t$ adjustment.

Another objective of the present invention is to provide a SOI device with high threshold voltage and lower junction leakage on an improved SOI substrate and a method for making the same.

A further objective according to the present invention is to provide a method for making a DRAM unit, possessing high threshold voltage and low junction leakage, on a SOI substrate formed by the SIMOX method.

The SOI device of the present invention comprises a MOS transistor formed on a SOI substrate. The SOI substrate includes a first insulating layer, a first semiconductor layer having a first conductivity type, a second insulating layer, and a second semiconductor layer having a first conductivity type, formed on a substrate, respectively. The MOS transistor includes a gate formed on the second semiconductor layer and a source and drain region, having a second conductivity type, formed on either side of the gate in the second conductive layer. A first and second oxidation region are formed in the first semiconductor layer below the source and the drain, respectively. Both the first and second oxidation regions are contiguous with the second insulating layer.

In another embodiment of the present invention, a SOI DRAM unit comprising a MOS transistor and an improved SOI substrate having back-gate control is provided. The SOI substrate includes a first insulating layer, a back-gate layer having a first conductivity type positioned on the first insulating layer, a second insulating layer, and a silicon layer having a first conductivity type formed on a substrate, respectively.

The MOS transistor includes a gate formed on the silicon layer and a source and drain region, having a second conductivity type, formed on either side of the gate in the silicon layer, wherein the source and the drain electrically connects to a bit line and a capacitor, respectively. A first oxidation region is formed in the back-gate layer below the source and a second oxidation region is formed in the back-gate layer below the drain. Both the first and the second oxidation regions are contiguous with the second insulating layer.

These and other objectives of the present invention will no doubt become obvious to those of ordinary skill in the art after having read the following detailed description of the preferred embodiment illustrated in the various figures and drawings.

DETAILED DESCRIPTION OF THE PREFERRED EMBODIMENT

Figure 1:
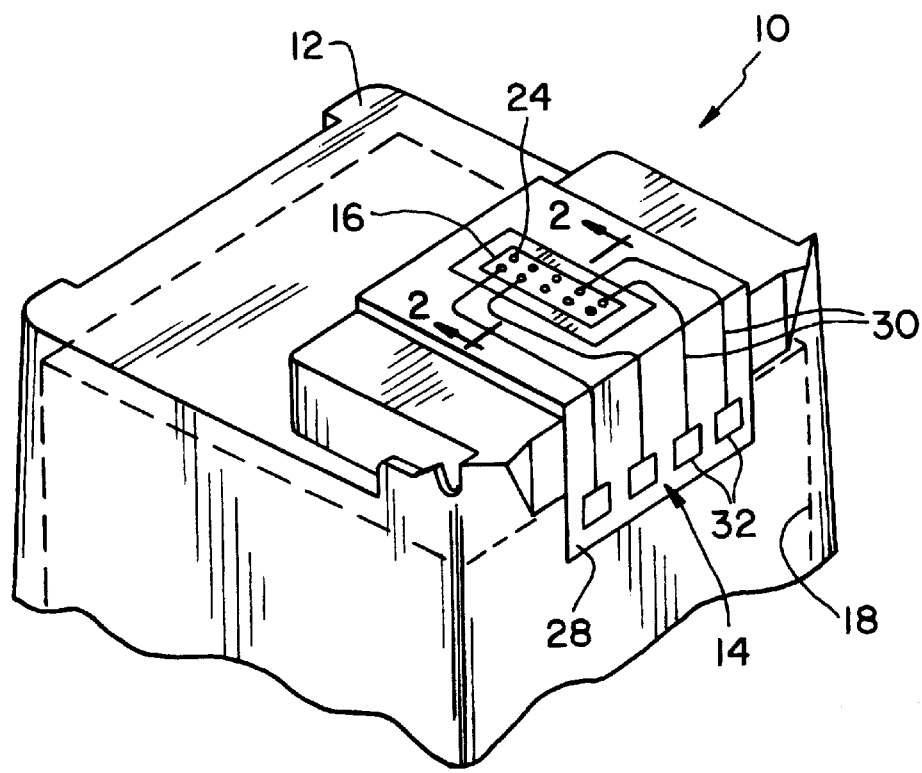
FIG. 1 to FIG. 8 are cross-sectional diagrams of the process of making a MOS transistor on a SOI substrate according to the present invention.

Please refer to FIG. 1 to FIG. 8. FIG. 1 to FIG. 8 are cross-sectional diagrams of making a MOS transistor having high threshold voltage on a SOI substrate 100. The figures are examples and not drawn to scale. As shown in FIG. 1, a SOI substrate 100 is first provided. The SOI substrate 100 includes a silicon substrate 103, a buried oxide layer 102, and a P-type silicon layer 101, respectively. In the preferred embodiment according to the present invention, the SOI substrate 100 is a commercially available product formed by a SIMOX method, and the thickness of the P-type silicon layer 101 is approximately 3 micrometers. The method of fabricating the SOI substrate 100 is not the major factor of the present invention and is omitted in the following discussion. Some methods for manufacturing the SOI substrate 100 are disclosed in U.S. Pat. No. 5,665,631, No. 5,753,353, and No. 6,074,928.

Figure 2:
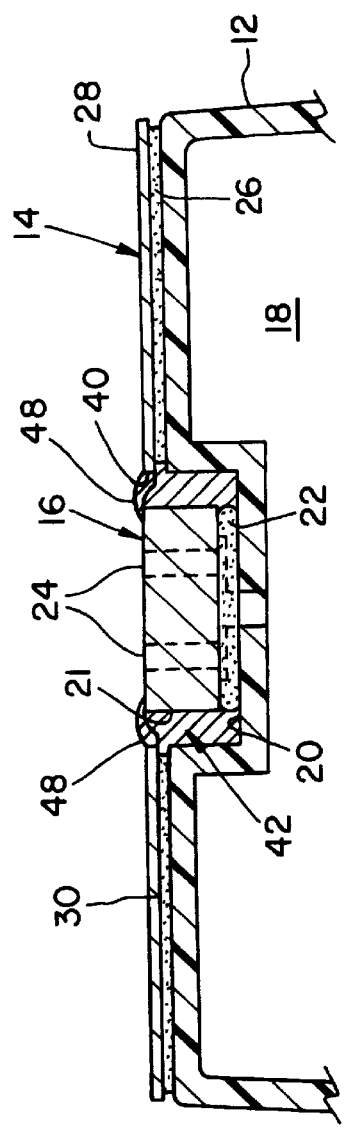

As shown in FIG. 2, an oxygen ion implantation process 202 is then performed to form a silicon dioxide insulating layer 104 in the P-type silicon layer 101. In the preferred embodiment of the present invention, the thickness of the silicon dioxide 104 is approximately 300 angstroms (Å), and the thickness of the first silicon layer 101a is approximately 1 micrometer. The silicon layer 101 divides into an upper and lower layer, which are denoted as the first silicon layer 101a and the second silicon layer 101b, respectively. The second silicon layer 101b serves as a back-gate electrode.

Changes in the threshold voltage of a conventional MOS transistor coincides with the voltage application to a substrate. However, variation in the threshold voltage of the SOI transistor differs from that of the conventional MOS transistor. The changes in the threshold voltage of the SOI transistor corresponds with the thickness of the buried oxide layer, i.e. the silicon dioxide layer 104. It should be noted that the thickness of the silicon dioxide layer 104 is not limited to 300 angstroms but depends on the manufacturing process and product specifications. The silicon dioxide layer 104 should be as thin as possible, generally at an approximate thickness of 50 to 400 angstroms.

The oxygen ion implantation process 202 results in damage surface of the first silicon layer 101a after bombardment by the oxygen ions and a 950 to 1000° C. annealing process is used to performed to repair the damage.

Figure 3:
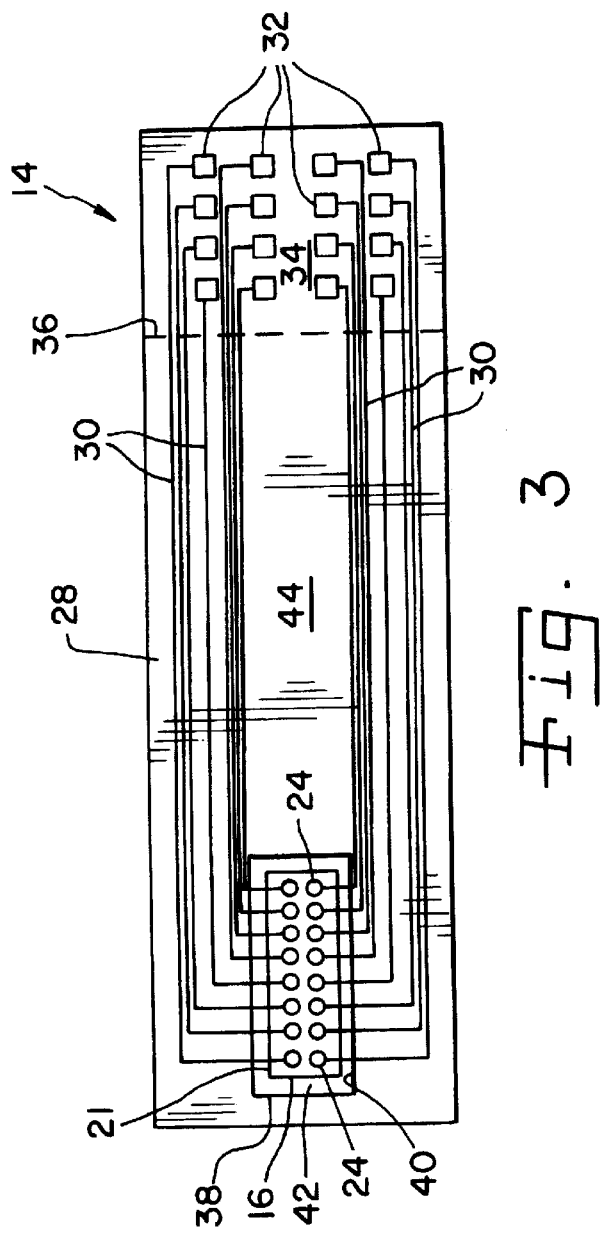

As shown in FIG. 3, a shallow trench isolation (STI) process is performed to form an STI 110 in the first silicon layer 101a. The STI 110 also defines active areas 112. The formation of the STI 110 first requires the formation of a trench 111 in the first silicon layer 101a by the use of a lithographic process followed by a reactive ion etching (RIE) process. The silicon dioxide layer 104 serves as an etching stop layer. An insulating material, such as silicon dioxide or high-density plasma oxide (HDP oxide), is then deposited on the surface of the substrate 100 and filling in the trench 111. Finally, a chemical-mechanical-polishing (CMP) process is used to complete the fabrication of the STI 110.

Figure 4:
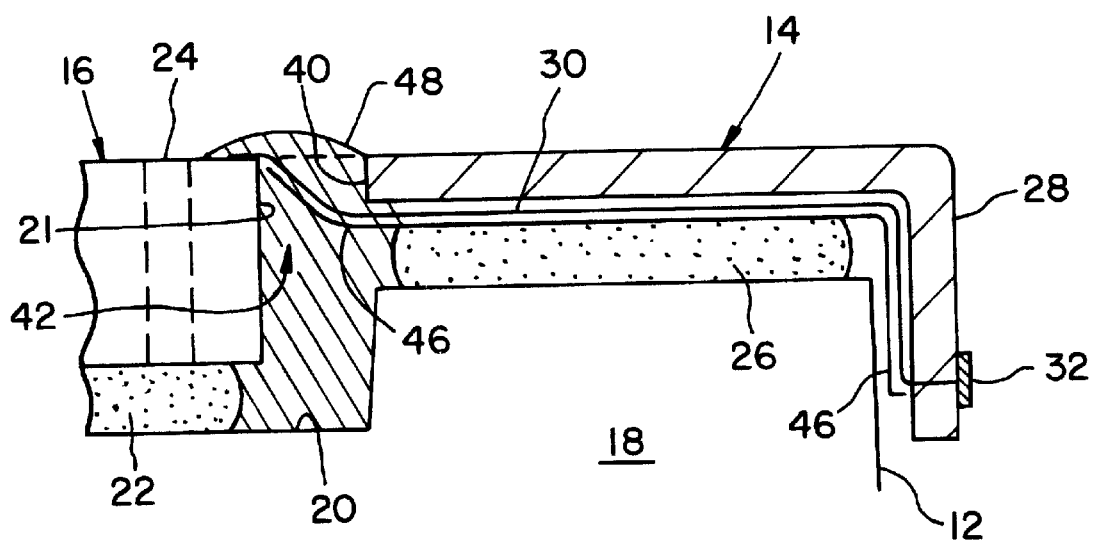

As shown in FIG. 4, a gate electrode 122 is then formed in each active area 112 on the surface of the first silicon layer 101a. The gate electrode 122 comprises a gate oxide layer 123 and a doped polysilicon layer 124, respectively. Spacers 125, composed of silicon dioxide or silicon nitride, are formed on either side of the gate electrode 122. In another preferred embodiment, the gate electrode 122 further comprises a self-aligned silicide (salicide) layer (not shown) above the doped polysilicon layer 124 to lower the resistance of the gate electrode 122. Conventional lithographic, etching and chemical vapor deposition (CVD) processes are used in the fabrication of the gate electrode 122. These processes are obvious to those skilled in the art, so further details relating to the formation of the gate electrode are omitted.

Figure 5:
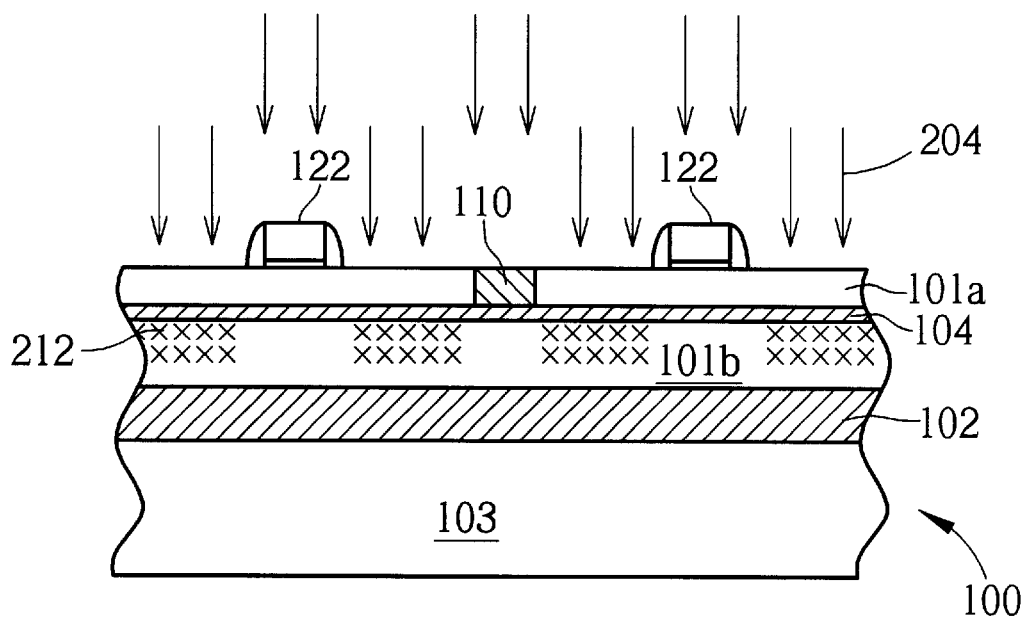
Figure 6:
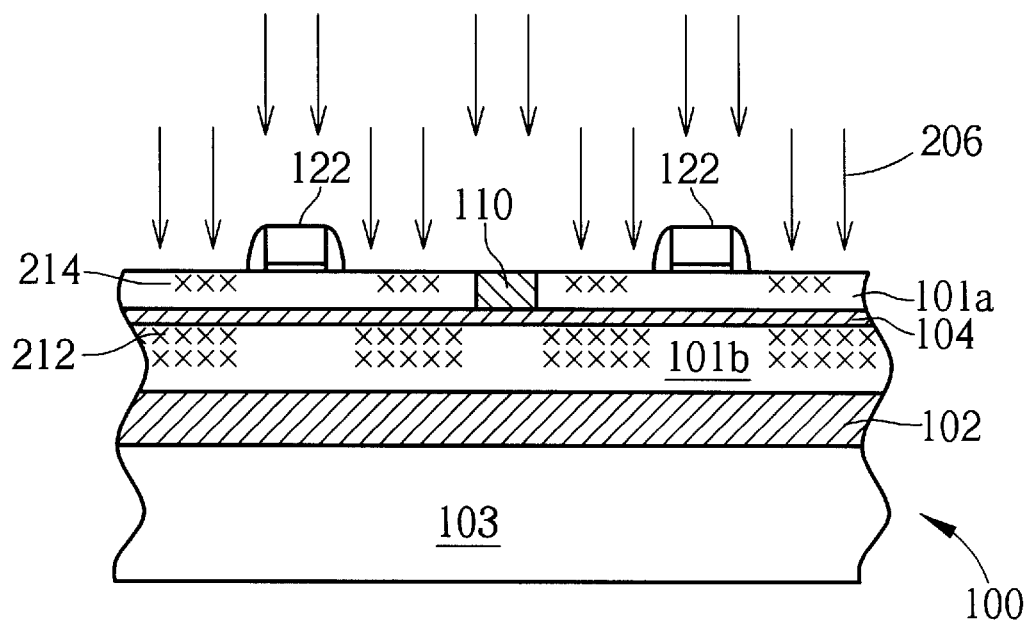

Thereafter, as shown in FIG. 5, the substrate 100 is subjected to an oxygen implantation process 204 to form self-aligned oxygen doped regions 212 in the second silicon layer 101b. In the preferred embodiment, the oxygen energy of the oxygen implantation 204 is approximately 100 KeV, and the dosage is approximately 3.6E17 ions/cm². The resulting oxygen doped regions 212 are located beneath the silicon dioxide layer 104. As shown in FIG. 6, the substrate 100 is then subjected to a N⁺ ion implantation process 206 to form source and drain regions 214 in the first silicon layer 101a adjacent to the gate electrode 122. In the N⁺ ion implantation process 206, the ion energy is approximately 100 to 400 Kev, the dosage is approximately 3E17 to 5E17 ions/cm², and the dopant may be arsenic, phosphorus, or the like.

Figure 7:
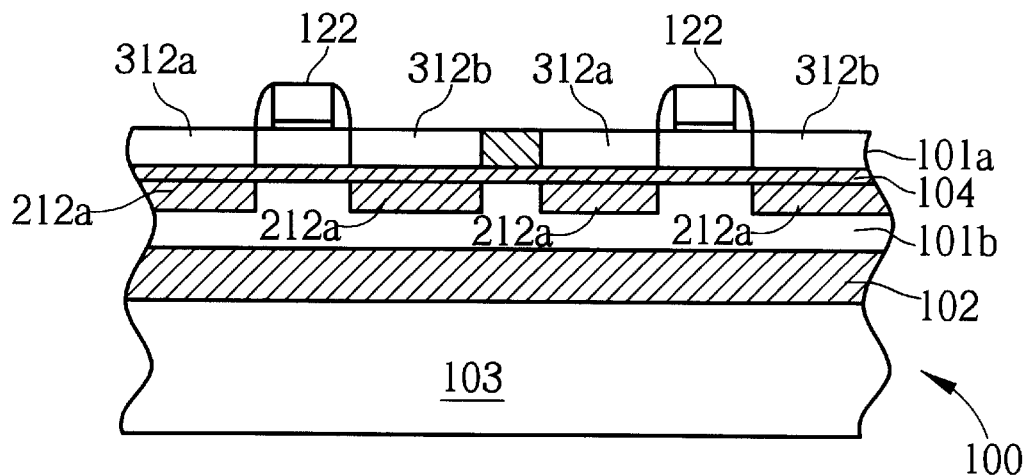
Figure 8:
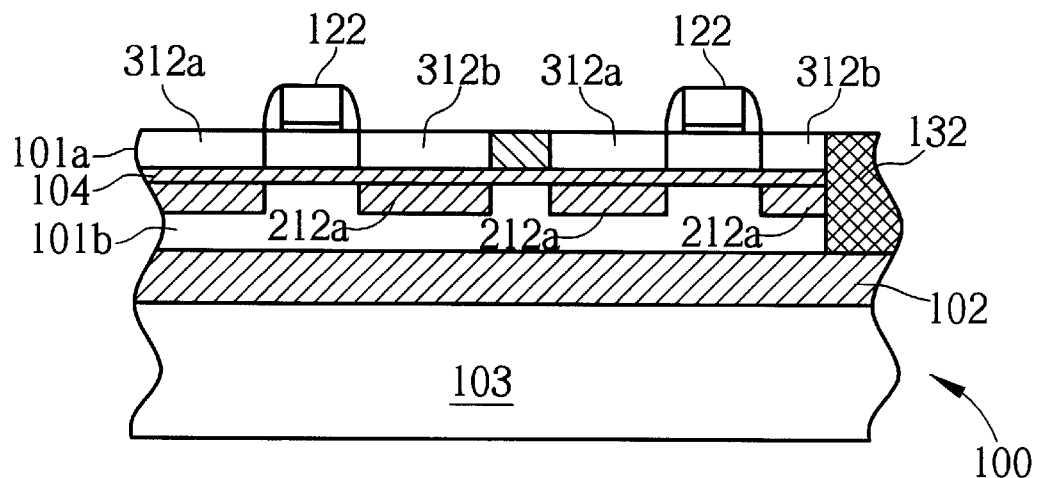

As shown in FIG. 7, a thermal drive-in (annealing) process is performed to activate the dopants implanted into the first silicon layer 101a and the second silicon layer 101b, i.e. the oxygen doped region 212 and source/drain regions 214, as well as obtaining the desired diffusion profile. The resulting thermally treated oxygen doped regions are denoted as oxidation regions 212a. The resulting thermally treated source/drain regions are denoted as source/drain regions 312a and 312b respectively. As shown in FIG. 8, a P well pick-up 132 is formed to connect the second silicon layer 101b with a bias voltage supply. The method of forming the P well pick-up 132 involves the formation of a hole (not shown), followed by the use of a P⁺ ion implantation process on a polysilicon material filled in the hole to complete the P well pick-up 132.

In another preferred embodiment, the silicon layer 101 in the present invention is N-type, the drain region 312b and the source region 312a are P-type, and the well pick-up 132 is N-type.

Figure 9:
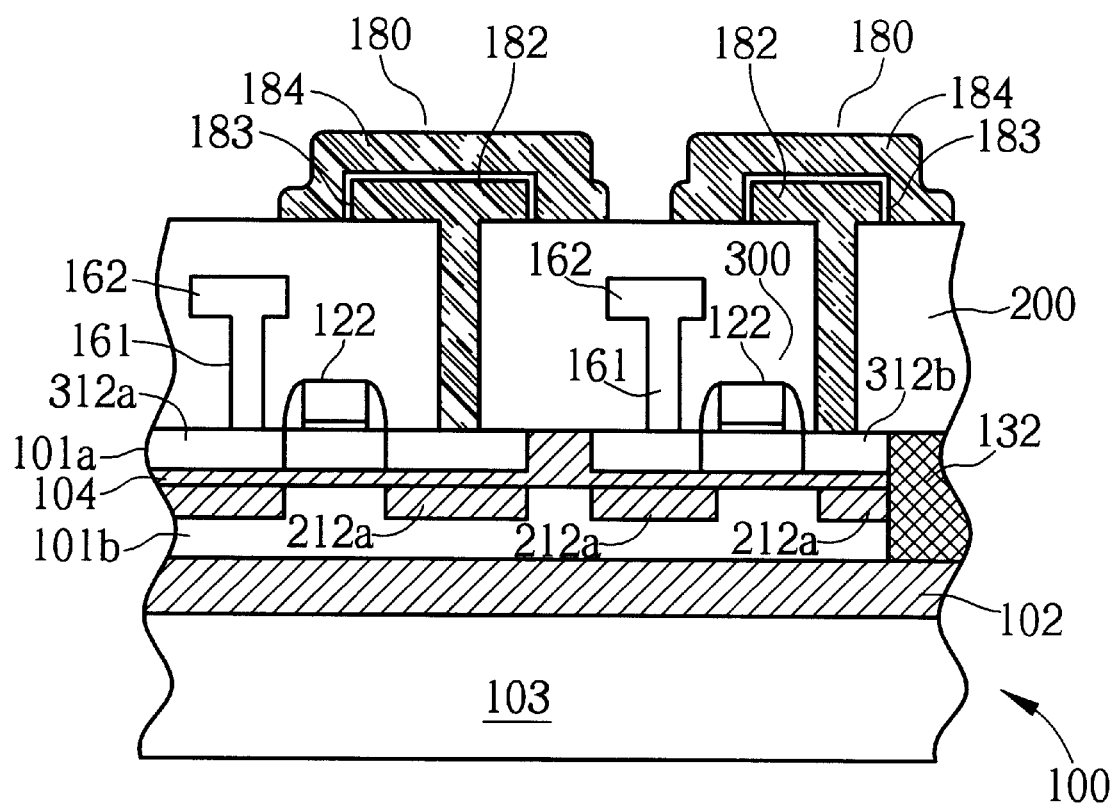
FIG. 9 is another embodiment illustrating the process of making a DRAM unit according to the present invention.

Please refer to FIG. 9. FIG. 9 is a sectional view of a DRAM cell 200 according to an embodiment of the present invention. In the preferred embodiment, the DRAM cell 200 having a N-channel MOS transistor 300 is disclosed. However, it is also obvious to those skilled in the art that the present invention is applicable to the DRAM cell 200 having a P-channel MOS transistor. The DRAM cell 200 comprises a SOI transistor 300 formed on an improved SOI substrate 100, more specifically, on an isolated first silicon layer 101a. The SOI substrate 100 includes a silicon substrate 103, an insulating layer 102, a P-type silicon layer 101b, respectively, and a P-type silicon layer 101a separated from the silicon layer 101b by a thin insulating layer 104 formed by the oxygen implantation method. As well, the silicon substrate 103 may be replaced by a glass substrate. The MOS transistor 300 includes a gate 122 formed on the silicon layer 101a, a source region 312a connected to a bit line 162 via a plug 161, and a drain region 312b formed on either side of the gate 122 in the isolated silicon layer 101a, to induce a channel region of the silicon layer 101a under the gate electrode 122. Each DRAM cell further comprises a capacitor 180, comprised of a storage node 182, an ONO dielectric layer 183 and a top plate 184, electrically connecting with the drain region 312b of the MOS transistor 300. Oxidation regions 212a are formed in the silicon layer 101b (back-gate layer) below the source region 312a and the drain region 312b, respectively.

The oxidation regions 212a are contiguous with the insulating layer 104. When a bias voltage is applied to the back-gate layer 101b, the back-gate bias can control the channel to improve the device performance. Furthermore, when back-gate biased depletion occurs at the junction between each of the oxidation regions 212a and the back-gate layer 101b, the parasitic junction capacitance is effectively reduced.

In contrast to the prior art SOI DRAM device, the present invention applies an oxygen ion implantation process to form an insulating layer 104 in the silicon layer 101, divides the silicon layer 101 into the upper and lower layer (the silicon layer 101a and the silicon layer 101b, respectively. The silicon layer 101b electrically connects to a bias voltage providing a back gate voltage through the well pick-up 132, to effectively control the gate threshold voltage and obtain improved channel control.

Those skilled in the art will readily observe that numerous modifications and alternations of the device may be made while retaining the teachings of the invention. Accordingly, the above disclosure should be construed as limited only by the metes and bounds of the appended claims.

What is claimed is:

1. A DRAM unit comprising:
    a SOI substrate including:
        a first insulating layer formed on a substrate;
        a first semiconductor layer having a first conductivity type positioned on the first insulating layer;
        a second insulating layer formed on the first semiconductor layer; and
        a second semiconductor layer having a first conductivity type formed on the second insulating layer;
    a MOS transistor including a gate formed on the second semiconductor layer and a source and drain region, having a second conductivity type, formed on either side of the gate in the second semiconductor layer, wherein the source and the drain electrically connects to a bit line and a capacitor, respectively;
    a first oxidation region formed in the first semiconductor layer below the source; and
    a second oxidation region formed in the first semiconductor layer below the drain;
    wherein both the first and the second oxidation region are contiguous with the second insulating layer, but not with the first insulating layer, wherein applying a bias voltage to the first semiconductor layer via a well pick-up having a first conductivity type in the SOI substrate to allow the first and second oxidation regions to reduce the source/drain parasitic capacitance.

2. The DRAM unit of claim 1 wherein the first insulating layer is formed by a SIMOX method or a thermal oxidation process.

3. The DRAM unit of claim 1 wherein the second insulating layer is formed by a SIMOX method.

4. The DRAM unit of claim 3 wherein the thickness of the second insulating layer is approximately 50 to 400 angstroms.

5. The DRAM unit of claim 1 wherein the thickness of the second semiconductor layer is approximately 1 micrometer.

6. The DRAM unit of claim 1 wherein the first conductivity type is P type and the second conductivity type is N type.

7. The DRAM unit of claim 1 wherein the MOS transistor further comprises a gate dielectric layer formed between the gate and the second semiconductor layer to induce a channel under the gate in the second semiconductor layer.

8. The DRAM unit of claim 1 wherein the substrate is a silicon substrate.

9. A SOI device having a back-gate layer comprising:
    a SOI substrate including:
        a first insulating layer formed on a substrate;
        a back-gate layer having a first conductivity type positioned on the first insulating layer;
        a second insulating layer formed on the back-gate layer; and
        a silicon layer having a first conductivity type formed on the second insulating layer;
    a MOS transistor including a gate formed on the silicon layer and a source and drain region, having a second conductivity type, formed on either side of the gate in the silicon layer; and
    a first and a second oxidation region both having a second conductivity type formed in the back-gate layer below the source and the drain, respectively;
    wherein both the first oxidation region and the second oxidation region are contiguous with the second insulating layer, but not with the first insulating layer.

10. The DRAM unit of claim 9 wherein the first insulating layer is formed by a SIMOX method or a thermal oxidation process.

11. The DRAM unit of claim 9 wherein the second insulating layer is formed by a SIMOX method.

12. The DRAM unit of claim 11 wherein the thickness of the second insulating layer is approximately 50 to 400 angstroms.

13. The DRAM unit of claim 9 wherein the thickness of the second semiconductor layer is approximately 1 micrometer.

14. The DRAM unit of claim 9 wherein the first conductivity type is P type and the second conductivity type is N type.

15. The DRAM unit of claim 9 wherein the bias voltage applied to the silicon layer is supplied by a bias voltage power supply via a well pick-up having a first conductivity type in the SOI substrate.

16. The DRAM unit of claim 9 wherein the MOS transistor further comprises a gate dielectric layer formed between the gate and the silicon layer to induce a channel under the gate in the silicon layer.

17. The DRAM unit of claim 9 wherein the substrate is a silicon substrate or a glass substrate.

* * * * *